United States Patent
Jung et al.

(10) Patent No.: US 12,260,905 B2
(45) Date of Patent: Mar. 25, 2025

(54) SRAM WITH IMPROVED WRITE PERFORMANCE AND WRITE OPERATION METHOD THEREOF

(71) Applicant: UIF (University Industry Foundation), Yonsei University, Seoul (KR)

(72) Inventors: Seong Ook Jung, Seoul (KR); Keon Hee Cho, Seoul (KR); Ji Sang Oh, Seoul (KR); Min June Yeo, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 184 days.

(21) Appl. No.: 18/168,943

(22) Filed: Feb. 14, 2023

(65) Prior Publication Data

US 2023/0377639 A1 Nov. 23, 2023

(30) Foreign Application Priority Data

May 17, 2022 (KR) .......................... 10-2022-0060393

(51) Int. Cl.
*G11C 11/418* (2006.01)
*G11C 11/419* (2006.01)

(52) U.S. Cl.
CPC .......... *G11C 11/419* (2013.01); *G11C 11/418* (2013.01)

(58) Field of Classification Search
CPC ... G11C 11/419; G11C 11/418; G11C 7/1096; G11C 8/08; G11C 11/412
USPC .......................................................... 365/154
See application file for complete search history.

(56) References Cited

U.S. PATENT DOCUMENTS

| | | | |
|---|---|---|---|
| 2002/0071323 A1* | 6/2002 | Lee | G11C 11/418 365/200 |
| 2016/0111143 A1 | 4/2016 | Lin et al. | |
| 2023/0197154 A1* | 6/2023 | Chen | G11C 15/04 365/49.11 |

FOREIGN PATENT DOCUMENTS

| | | |
|---|---|---|
| CN | 114388028 A | 4/2022 |
| KR | 10-2018-0114982 A | 10/2018 |

* cited by examiner

*Primary Examiner* — Huan Hoang

(57) ABSTRACT

An SRAM comprises: a memory cell array in which a plurality of memory cells each defined by a word line and a bit line pair are arranged; a write driver that applies a write voltage corresponding to the applied data to a bit line pair connected to the memory cell; and a word line driver activating the word line after the write voltage is applied to the bit line pair and after a pre-develop period.

12 Claims, 9 Drawing Sheets

SRAM WITH IMPROVED WRITE PERFORMANCE AND WRITE OPERATION METHOD THEREOF

CROSS-REFERENCE TO RELATED APPLICATIONS

This application claims priority under 35 U.S.C. § 119(a) to Korean Patent Application No. 10-2022-0060393, filed on May 17, 2022, in the Korean Intellectual Property Office, the disclosure of which is incorporated herein in its entirety by reference.

BACKGROUND

1. Technical Field

The disclosed embodiments relate to an SRAM and a write operation method thereof, and more particularly to an SRAM with improved write performance and a write operation method thereof.

2. Description of the Related Art

SRAM (Static Random Access Memory) has a disadvantage in that it is larger than DRAM (Dynamic Random Access Memory), but has been steadily used in various fields due to its fast operation speed and the characteristics of being able to maintain data without a refresh operation. In particular, SRAM can be easily embedded in chips in various electronic devices due to its compatibility with general logic processes. As a result, SRAM plays a role as an embedded memory in various fields, such as being used as a cache memory that provides fast data access to a processor core, or being used as a buffer memory to support high-speed read/write operations of various non-volatile memories or CIM (Computing-In-Memory) to process artificial neural networks or big data operations at high speed.

Meanwhile, in order to reduce manufacturing costs along with the demand for high performance, miniaturization and low power consumption of electronic devices, semiconductor memory processes have been continuously miniaturized, and due to this miniaturization of the process, the pitch of various lines such as word lines and bit lines of the memory cell array has been greatly reduced. The reduction in line width results in an increase in interconnect resistance due to surface current and particle scattering effects in the line. In recent years, research on ultra-fine processes at the level of 3 to 4 nm has been actively conducted, and as memory capacity increases, operational instability due to interconnect resistance has reached a level that cannot be ignored. In SRAM, in particular, write failure due to deterioration in writeability has become a major issue. In order to solve this problem, a dual bitline technique, a dual write driver technique, a write-assist cell technique, etc. have been proposed, but the proposed techniques have limitations in that power consumption increases and the size of the SRAM increases due to an additional configuration.

SUMMARY

An object of the present disclosure is to provide an SRAM and a write operation method thereof, capable of improving writeability without increasing the size.

Another object of the present disclosure is to provide an SRAM and a write operation method thereof, capable of preventing a decrease in write operation speed while improving writeability.

An SRAM according to an embodiment of the present disclosure, conceived to achieve the objectives above, comprises: a memory cell array in which a plurality of memory cells each defined by a word line and a bit line pair are arranged; a write driver that applies a write voltage corresponding to the applied data to a bit line pair connected to the memory cell; and a word line driver activating the word line after the write voltage is applied to the bit line pair and after a pre-develop period.

The pre-develop period may be determined according to a time having a first voltage and a second voltage level lower than the first voltage, by a write voltage applied to the bit line pair.

The SRAM may further include a control circuit that receives an address and a command, and if the received command is a write command, applies a column address and a write control signal to the write driver, and applies a row address to the word line driver after the pre-develop period.

The SRAM may further include a write auxiliary circuit activated during the pre-develop period to temporarily apply a third voltage having a lower voltage level than the second voltage to a line to which the second voltage is applied among the bit line pair.

The write auxiliary circuit may include: an auxiliary transistor that is turned on, when a write auxiliary enable signal is deactivated, to drop a virtual ground node to the second voltage level; two auxiliary drivers respectively inverting data or inverted data and applying an auxiliary voltage to the bit line pair when the auxiliary transistor is turned on and the virtual ground node has the second voltage level; and a coupling capacitor temporarily dropping the voltage level of the virtual ground node to the third voltage level by a coupling method when a delayed and inverted write auxiliary enable signal is applied in which the write auxiliary enable signal is inverted and delayed, after the auxiliary transistor is turned off.

The write auxiliary enable signal may be applied from the control circuit, and may be activated with a time delay shorter than the pre-develop period after the write control signal is activated.

Each of the two auxiliary drivers may include a PMOS transistor and an NMOS transistor connected in series between the first voltage and the virtual ground node and having gates to which the inverted data or the data is applied.

The memory cell may include a latch having a structure in which two inverters are interconnected, each having a pull-up transistor and a pull-down transistor connected in series between the first voltage and the second voltage, and two pass gate transistors connected between both ends of the latch and the bit line pair and having gates connected to the word line.

A write operation method of an SRAM according to an embodiment of the present disclosure, the SRAM having a memory cell array in which a plurality of memory cells each defined by a word line and a bit line pair are arranged, the write operation method comprising the steps of: applying a write voltage corresponding to the applied data to the bit line pair connected to the memory cell; and activating the word line after a pre-develop period after the write voltage is applied to the bit line pair.

Accordingly, the SRAM and the write operation method thereof according to the embodiment can drive a write driver to apply a write voltage according to data to a bit line pair and then activate a word line, and, when a memory cell located at a long distance is written by a write driver, generate a momentary large current to perform a write operation, thereby improving writeability without increasing the size. In addition, by using an auxiliary circuit to rapidly change the voltage level of a bit line pair, it is possible to prevent a write speed from being lowered.

DETAILED DESCRIPTION OF THE INVENTION

Hereinafter, exemplary embodiments of the present disclosure will be described in detail with reference to the drawings. The following detailed description is provided to help comprehensive understanding of a method, an apparatus, and/or a system disclosed herein. However, this is merely exemplary, and the present disclosure is not limited thereto.

While describing the present disclosure, when it is determined that a detailed description of a known art related to the present disclosure may unnecessarily obscure the gist of the present disclosure, the detailed description will be omitted. Terms which will be used below are defined in consideration of functionality in the present disclosure, which may vary according to an intention of a user or an operator or a usual practice. Therefore, definitions thereof should be made on the basis of the overall contents of this specification. Terminology used herein is for the purpose of describing exemplary embodiments of the present disclosure only and is not intended to be limiting. The singular forms are intended to include the plural forms as well, unless the context clearly indicates otherwise. It should be understood that the terms "comprises," "comprising," "includes," and "including," when used herein, specify the presence of stated features, numerals, steps, operations, elements, or combinations thereof, but do not preclude the presence or addition of one or more other features, numerals, steps, operations, elements, or combinations thereof. Also, terms such as "unit", "device", "module", "block", and the like described in the specification refer to units for processing at least one function or operation, which may be implemented by hardware, software, or a combination of hardware and software.

Figure 1:
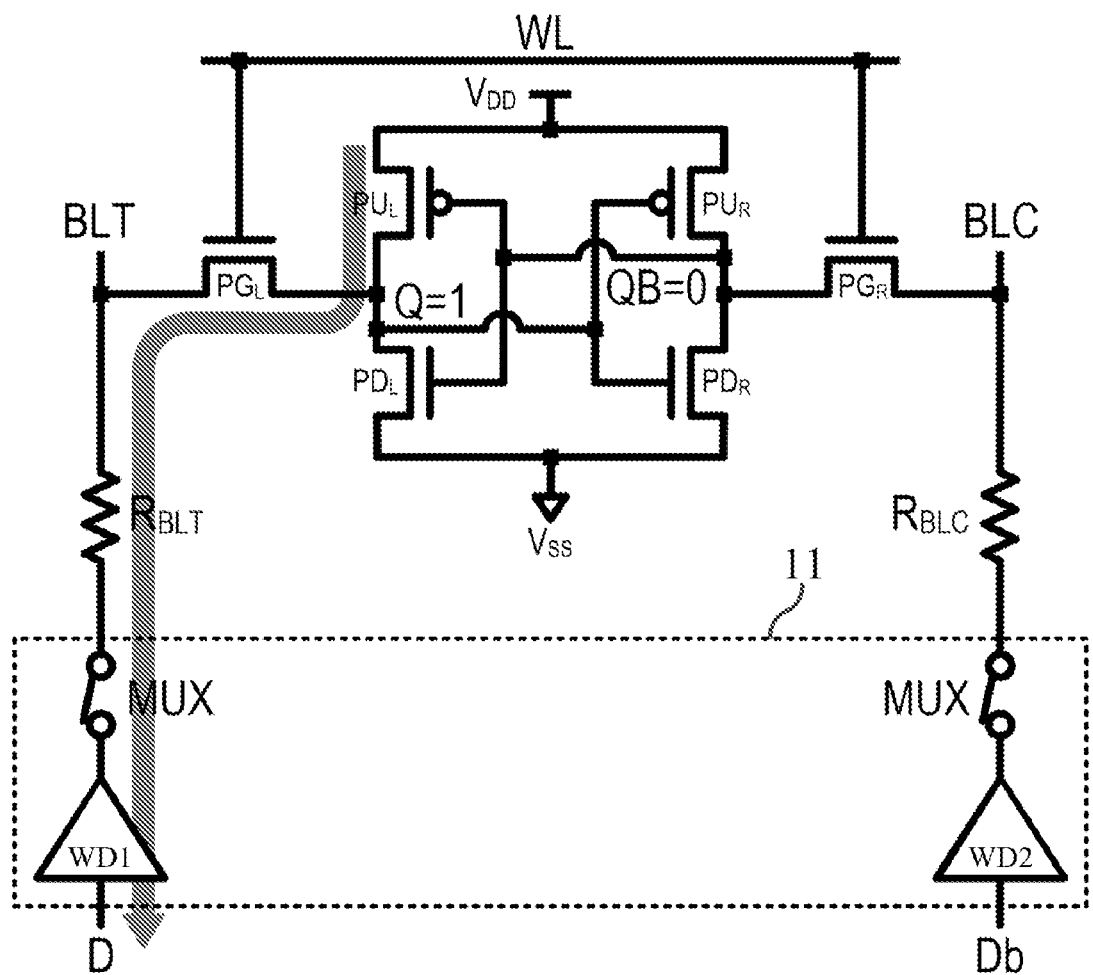
FIGS. 1 to 3 are diagrams for explaining write failure of an SRAM.
Figure 2:
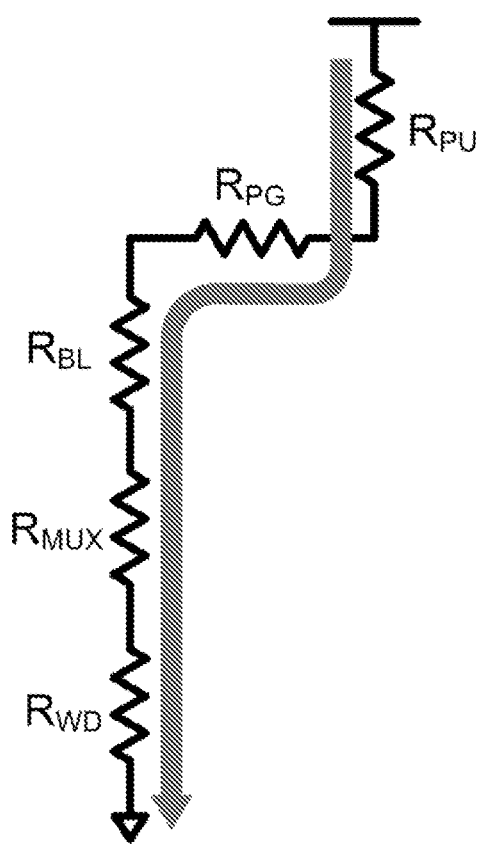
Figure 3:
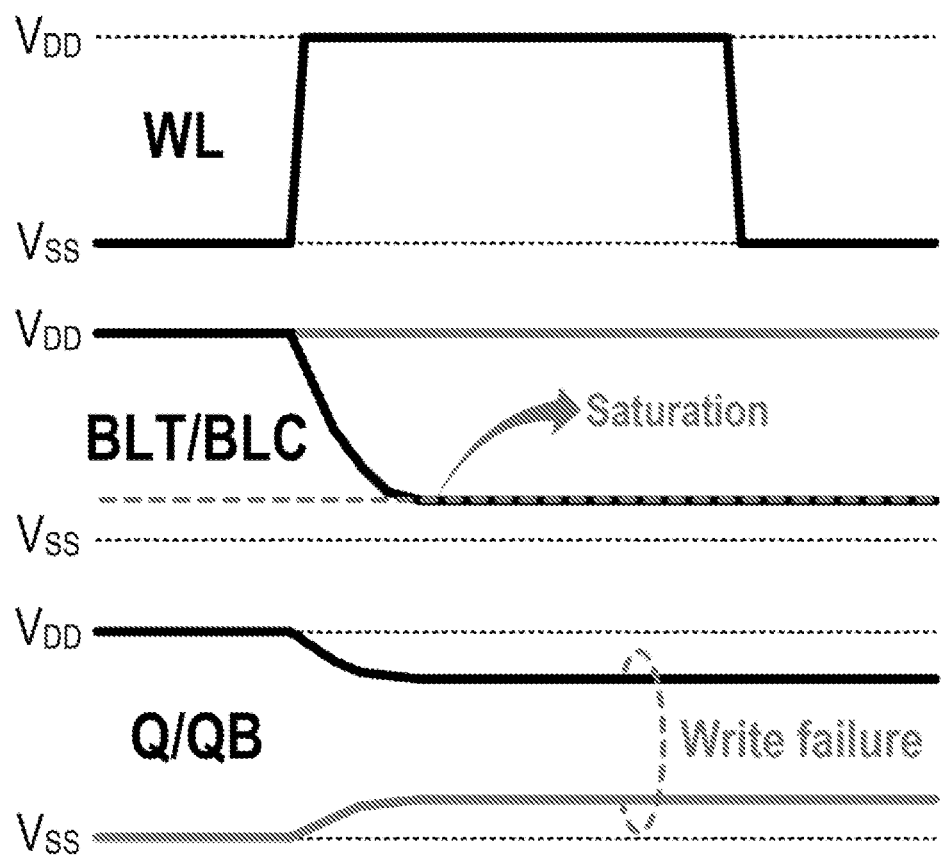

FIGS. 1 to 3 are diagrams for explaining write failure of an SRAM. FIG. 1 shows a structure of an SRAM memory cell, FIG. 2 shows an equivalent circuit for a resistive element that causes a write failure, and FIG. 3 shows a timing diagram of a conventional write operation.

FIG. 1 shows a memory cell having a 6T structure, which is a typical SRAM memory cell. As shown in FIG. 1, the 6T memory cell includes a latch having a structure in which two inverters are interconnected, each having a pull-up transistor ($PU_L$, $PU_R$) and a pull-down transistor ($PD_L$, $PD_R$) connected in series between a first voltage (here, for example, power supply voltage ($V_{DD}$)) and a second voltage (here, for example, ground voltage ($V_{SS}$)) having a voltage level lower than the first voltage, and first and second pass gate transistors ($PG_L$, $PG_R$) connected between a latch node pair (Q, QB) at both ends of the latch and a bit line pair (BLT, BLC).

Referring to FIGS. 1 and 3, in a conventional write operation method, first, a word line driver (not shown) activates at least one word line (WL) according to the applied row address, and a write driver 11 selects a bit line pair (BLT, BLC) using a MUX according to the applied column address, and drives the drivers (WD1, WD2) to apply write voltages corresponding to the applied data (D, Db) to the selected bit line pair (BLT, BLC).

Here, it is assumed that data "0" is written to an SRAM memory cell in which data "1" is stored. When data "1" is stored in the SRAM memory cell, the first latch node (Q) has a first voltage level corresponding to data "1", and the second latch node (QB) has a second voltage level corresponding to data "0". The write driver 11 may apply the second voltage as a first write voltage to the bit line (BLT) to write data "0", while applying the first voltage as a second write voltage to the bit line bar (BLC).

The first and second pass gate transistors ($PG_L$, $PG_R$) are turned on by the word line (WL) activated at the first voltage level to electrically connect the latch node pair (Q, QB) and the bit line pair (BLT, BLC). In addition, the write driver 11 applies the second voltage to the first latch node (Q) through the bit line (BLT) and applies the first voltage to the second latch node (QB) through the bit line bar (BLC). Accordingly, the voltage of the first latch node (Q) should drop from the first voltage level to the second voltage level, and the voltage of the second latch node (QB) should rise from the second voltage level to the first voltage level to store data "1" in the latch.

However, since the first pull-up transistor ($PU_L$) is in a state turned on according to the voltage level of the second latch node (QB), a current path is formed from the first voltage to the first driver (WD1) applying the second voltage through the first latch node (Q). This current path is represented by the equivalent circuit shown in FIG. 2. Referring to the equivalent circuit of FIG. 2, on the path from the first voltage to the first driver (WD1) through the first latch node (Q), there exist components of the resistance ($R_{PU}$) of the first pull-up transistor ($PU_L$), the resistance ($R_{PG}$) of the first pass gate transistor ($PG_L$), the resistance ($R_{BL}$) of the bit line (BLT), the resistance ($R_{MUX}$) of the MUX and the resistance ($R_{WD}$) of the first driver (WD1).

In the equivalent circuit of FIG. 2, the components of the resistance ($R_{PU}$) of the first pull-up transistor ($PU_L$), the resistance ($R_{PG}$) of the first pass gate transistor ($PG_L$), the resistance ($R_{MUX}$) of the MUX and the resistance ($R_{WD}$) of the first driver (WD1) may be different for each memory cell depending on the manufacturing process, but this difference can be reduced through process improvements.

However, as described above, not only is the line width narrowing due to the miniaturization of the semiconductor process, but also the number of memory cells integrated into the memory cell array increases due to the demand for memory capacity, so that, as the length of the bit line pair (BLT, BLC) is relatively longer than the line width, the interconnect resistance of the bit line pair (BLT, BLC) is greatly increased. In addition, the resistance ($R_{BL}$) of the bit line (BLT) varies due to a difference in length of the bit line (BLT) on a path according to a position between the write driver 11 and a memory cell in which data is stored. In this case, in the case of a memory cell located adjacent to the write driver 11, the bit line resistance ($R_{BL}$) is low, so that the voltage level of the bit line (BLT) easily drops to the second voltage level and data is stably written. On the other hand, in the case of a memory cell located far from the write driver 11, due to the high bit line resistance (R$_{BL}$), as shown in FIG. 3, a phenomenon occurs in which the voltage level of the bit line (BLT) does not easily drop to the second voltage level and becomes saturated at a voltage level higher than the second voltage.

At this time, the saturation voltage of the bit line (BLT) may be calculated by Equation 1.

$$\frac{R_{MUX\&WD} + R_{BL}}{R_{MUX\&WD} + R_{BL} + R_{PG} + R_{PU}} V_{DD} \quad \text{[Equation 1]}$$

In addition, when the voltage level of the bit line (BLT) is saturated, the voltage level of the latch node pair (Q, QB) does not change normally, and thus write failure may occur.

Such a write failure may occur in the same way when trying to write data "1" to a memory cell in which "data 0" is stored, but the only difference is that saturation occurs by the bit line resistance (R$_{BL}$) of the bit line bar (BLC).

Such a write failure appears as a decrease in the writeability yield of the SRAM.

Figure 4:
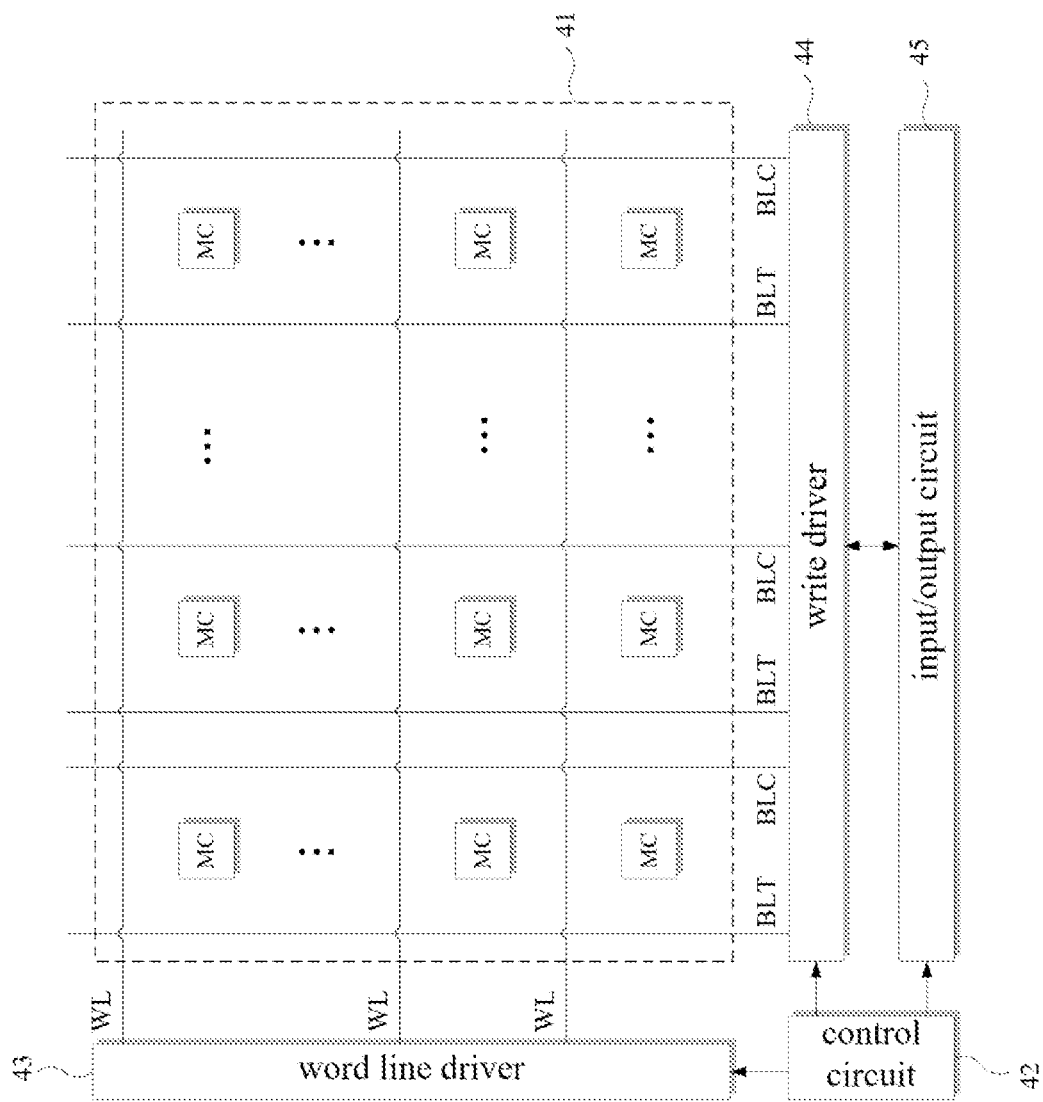
FIG. 4 shows a structure of an SRAM according to an embodiment.
Figure 5:
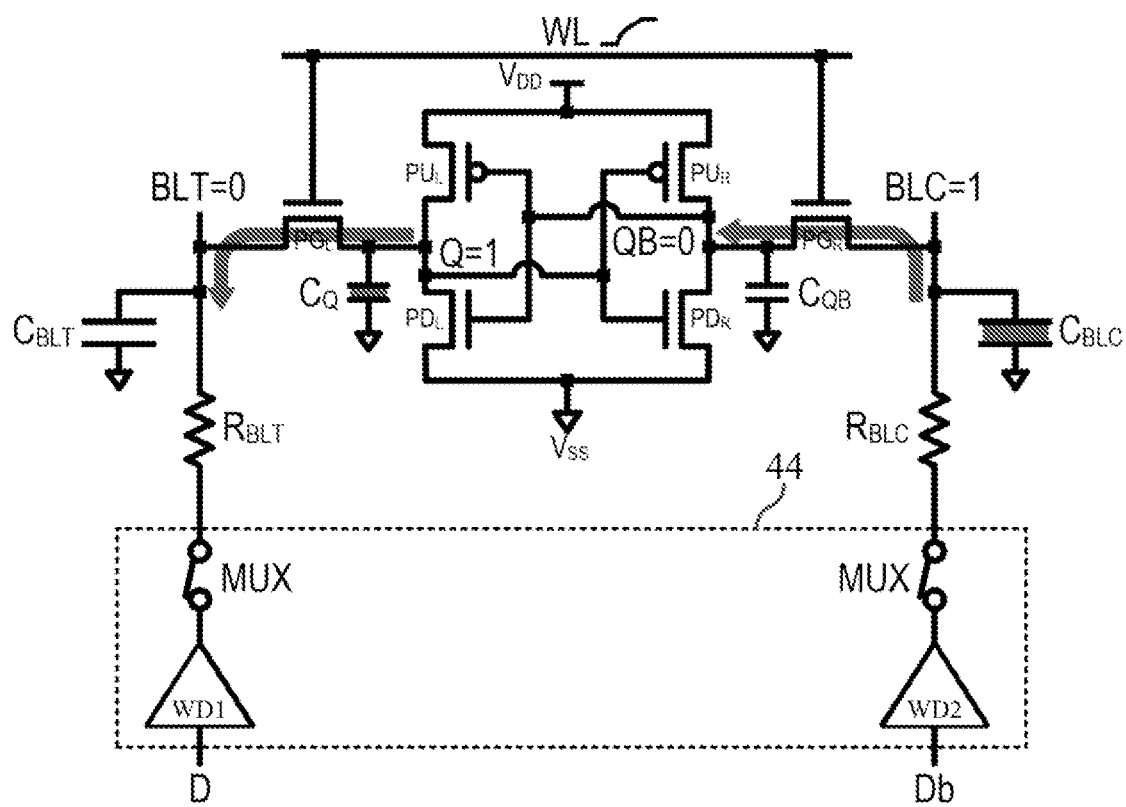
FIGS. 5 and 6 are diagrams for explaining a write operation of an SRAM memory cell according to an embodiment.
Figure 6:
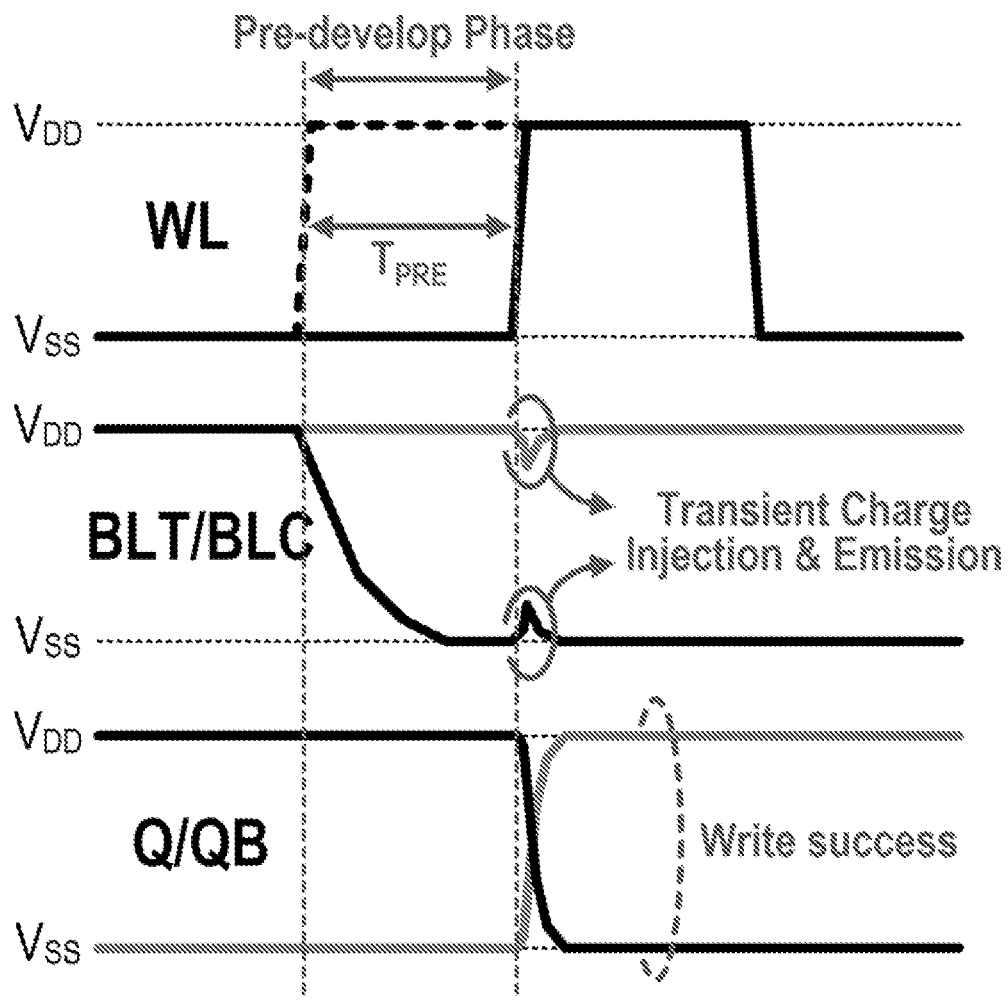

FIG. 4 shows a structure of an SRAM according to an embodiment, and FIGS. 5 and 6 are diagrams for explaining a write operation of an SRAM memory cell according to an embodiment.

Referring to FIG. 4, the SRAM memory according to an embodiment may include a memory cell array 41, a control circuit 42, a word line driver 43, a write driver 44 and an input/output circuit 45.

The memory cell array 41 may include a plurality of memory cells (MC) defined by a plurality of word lines (WL) and a plurality of bit line pairs (BLT, BLC). That is, each of the plurality of memory cells (MC) may be disposed at each position where a word line (WL) and a bit line pair (BLT, BLC) cross each other, and may be connected to at least one of the plurality of word lines (WL) and at least one of the bit line pairs (BLT, BLC).

Here, each of the plurality of memory cells (MC) may be an SRAM memory cell, and may be a 6T SRAM memory cell as shown in FIG. 5. However, the latch node capacitances (C$_Q$, C$_{QB}$) and the bit line capacitances (C$_{BLT}$, C$_{BLC}$) additionally shown in FIG. 5 compared to FIG. 1 mean parasitic capacitances and are not additional components. Therefore, since the structure of the 6T SRAM memory cell shown in FIG. 5 is the same as that of FIG. 1, it will not be described in detail here.

The control circuit 42 may receive a command, an address and a clock and output a row address (RA), a column address (CA) and a control signal. The control circuit 42 may obtain a row address (RA) and a column address (CA) from the applied address, and apply them to the word line driver 43 and the write driver 44, respectively. In addition, the control circuit 42 may decode the command to generate a read or write control signal, and may output the write control signal to the write driver 44.

The word line driver 43 selects and activates at least one of the plurality of word lines (WL) according to a row address (RA) applied from a control circuit 42, so that the plurality of memory cells of the memory cell array 41 are selected row by row.

The write driver 44 may select at least one bit line pair from among the plurality of bit line pairs (BLT, BLC) according to a row address (RA) applied from the control circuit 42, and connect it to a driver (WD1, WD2) that applies a write voltage. In addition, when a write control signal is applied from the control circuit 42, the write driver 44 applies a write voltage according to the data (D, db) applied from the input/output circuit 45 to the bit line pair (BLT, BLC) selected and connected by the write driver 44.

The input/output circuit 45 may receive data to be stored in the memory cell and transmit it to the write driver 44.

The SRAM may further include a sense amplifier (not shown) for reading data stored in the memory cell, but since the embodiment describes the write operation of the SRAM, it is omitted here. In addition, the SRAM may be implemented as an independent memory device, but may also be implemented as a cache memory implemented and used in a chip such as a CPU (Central Processing Unit), processor, microprocessor or application processor (AP), or a CIM (Computing-In-Memory) that processes calculations for artificial neural networks or big data at high speed, and used as an embedded memory.

Hereinafter, the write operation of the SRAM according to the present embodiment will be described with reference to FIGS. 4 to 6. Here too, the description is made on the assumption that data "0" is written to the memory cell (MC) where data "1" is stored, but the case of writing data "1" to the memory cell (MC) where data "0" is stored also operates in a similar manner.

During a write operation, when an address and a write command are first applied to the control circuit 42, the control circuit 42 applies a column address (CA) and a write control signal to the write driver 44. In addition, the input/output circuit 45 transmits the applied data to the write driver 44.

The write driver 44 controls the provided MUX according to the applied column address (CA) to connect at least one bit line pair (BLT, BLC) among a plurality of bit line pairs (BLT, BLC) to a driver (WD1, WD2) that applies a write voltage according to data. Accordingly, the driver (WD1, WD2) applies a voltage of a level corresponding to the applied data (D, db) to the connected bit line pair (BLT, BLC).

At this time, in the SRAM of the embodiment, the control circuit 42 does not apply the row address (RA) to the word line driver 43. Accordingly, the plurality of word lines (WL) of the memory cell array 41 are not activated, and thus the pass gate transistors (PG$_L$, PG$_R$) of each memory cell (MC) remain turned off. Since the first pull-up transistor (PU$_L$) of the memory cell (MC) in which data "1" is stored is turned on by the voltage level of the second latch node (here, second voltage), the first voltage (here, for example, power supply voltage (V$_{DD}$)) is applied to the first latch node (Q), but since the pass gate transistors (PG$_L$, PG$_R$) remain turned off, the first voltage applied to the first latch node (Q) is not applied to the bit line (BLT).

If the first voltage is not applied to the bit line (BLT), it can be considered that the first voltage item in Equation 1 is removed, and as a result, the voltage of the bit line (BLT) may drop to a level of the second voltage (herein, as an example, ground voltage (V$_{SS}$)) having a lower voltage level than the first voltage. That is, the voltage level of the bit line (BLT) may drop to the second voltage level without being saturated.

However, a latch node capacitance (C$_Q$) and a bit line capacitance (C$_{BLT}$) exist on a path between the latch node (Q) and the first driver (WD1). In particular, like the bit line resistance (R$_{BL}$), the bit line capacitance (C$_{BLT}$) appears larger as the location of the memory cell is farther from the write driver 44. By the latch node capacitance (C$_Q$) and the bit line capacitance ($C_{BLT}$), the voltage level of the bit line (BLT) does not drop rapidly, but gradually drops as shown in FIG. 6.

As such, an operation of precharging the voltage level of the bit line pair (BLT, BLC) according to data to be stored, before the word line (WL) is activated, is referred to as a pre-develop phase in the present embodiment.

In the pre-develop phase, the time interval, from the time when a bit line pair (BLT, BLC) is selected and a voltage according to data is applied until the word line (WL) is activated, is called a pre-develop period ($T_{PRE}$), and the pre-develop period (TARE) may be adaptively set in consideration of a line width according to a miniaturization process, the length of the bit line pair (BLT, BLC) according to the size of the memory cell array, etc.

Meanwhile, after the voltage level of the bit line (BLT) drops to the second voltage level, that is, after the pre-develop phase, the control circuit 42 applies a row address (RA) to the word line driver 43, and the word line driver 43 selects at least one word line from among a plurality of word lines according to the applied row address (RA) and activates it by applying a first voltage.

When the selected word line (WL) is activated, the two pass gate transistors ($PG_L$, $PG_R$) of the memory cell (MC) connected to the activated word line (WL) are turned on to electrically connect the latch node pair (Q, QB) and the bit line pair (BLT, BLC). At this time, since the first latch node (Q) has the first voltage level, while the voltage of the bit line (BLT) has already dropped to the second voltage level in the pre-develop phase, a voltage difference ($V_{DD}-V_{SS}$) exists between the first latch node (Q) and the bit line (BLT), and when the first pass gate transistor ($PG_L$) is turned on by this voltage difference, a momentary large current flows to the bit line (BLT), causing a transient charge emission phenomenon in which the voltage level of the first latch node (Q) rapidly drops to the second voltage level.

In addition, since the second latch node (QB) has the second voltage level, while the voltage of the bit line bar (BLC) has raised to the first voltage level in the pre-develop phase, a voltage difference ($V_{SS}-V_{DD}$) also exists between the second latch node (QB) and the bit line bar (BLC), and as soon as the second pass gate transistor ($PG_R$) is turned on by the voltage difference, a large current flows in the direction of the second latch node (QB), causing a transient charge injection phenomenon in which the voltage level of the second latch node (QB) rapidly rises to the first voltage level.

As shown in FIG. 3, such transient charge emission and transient charge injection phenomena instantaneously change the voltage levels of the first latch node (Q) and the second latch node (QB) so that data "0" is stored in the latch very stably.

The write operation described above is performed in the same manner even when storing data "1" in the memory cell (MC) in which data "0" is stored. However, it is different in that a transient charge injection phenomenon occurs in the first latch node (Q) and a transient charge emission phenomenon occurs in the second latch node (QB).

As a result, in the conventional SRAM, as shown in FIG. 3, write failures frequently occur due to simultaneous activation of the word line (WL) and the bit line pair (BLT, BLC), however in the present embodiment, as shown in FIG. 5 without any additional configuration, only with a simple timing change to ensure that the bit line pair (BLT, BLC) is activated first and the word line is activated after the pre-develop period ($T_{PRE}$), even in the case of memory cells (MC) placed far from the write driver 44, the frequency of write failures can be greatly reduced.

In the foregoing, it has been described that the pre-develop phase is obtained by the control circuit 42 delaying and applying the row address (RA) to the word line driver 43 by the pre-develop period ($T_{PRE}$) than the time point at which the control circuit 42 applies the column address (CA) and the write control signal to the write driver 44. However, the pre-develop phase may also be obtained by, the control circuit 42, applying the column address (CA) to the write driver 44 and the row address (RA) to the word line driver 43 at the same time, and by, the word line driver 43 receiving the row address (RA), activating the word line (WL) with a delay as much as the pre-develop period ($T_{PRE}$).

The SRAM of the embodiment allows the writeability yield to be greatly improved by simply delay activating the word line (WL). However, as described above, in the pre-develop phase, the voltage level of the bit line (BLT) gradually drops to the second voltage level by the latch node capacitance ($C_Q$) and the bit line capacitance ($C_{BLT}$). In particular, as the location of the memory cell is further from the write driver 44, the bit line capacitance ($C_{BLT}$) increases and becomes larger, and as a result, the pre-develop period ($T_{PRE}$) until the voltage level of the bit line (BLT) drops to the second voltage level becomes longer. In addition, when the pre-develop period ($T_{PRE}$) becomes long, the write operation speed of the SRAM becomes slow.

In order to prevent such a decrease in write operation speed, the SRAM of this embodiment may further include a write auxiliary circuit. The write auxiliary circuit may be configured separately, but may also be configured to be included in the write driver 44.

The write auxiliary circuit reduces the pre-develop period ($T_{PRE}$) by enabling the bit line (BLT) or bit line bar (BLC) to drop to the second voltage level more quickly in the pre-develop phase, thereby preventing a write operation speed from being lowered.

Figure 7:
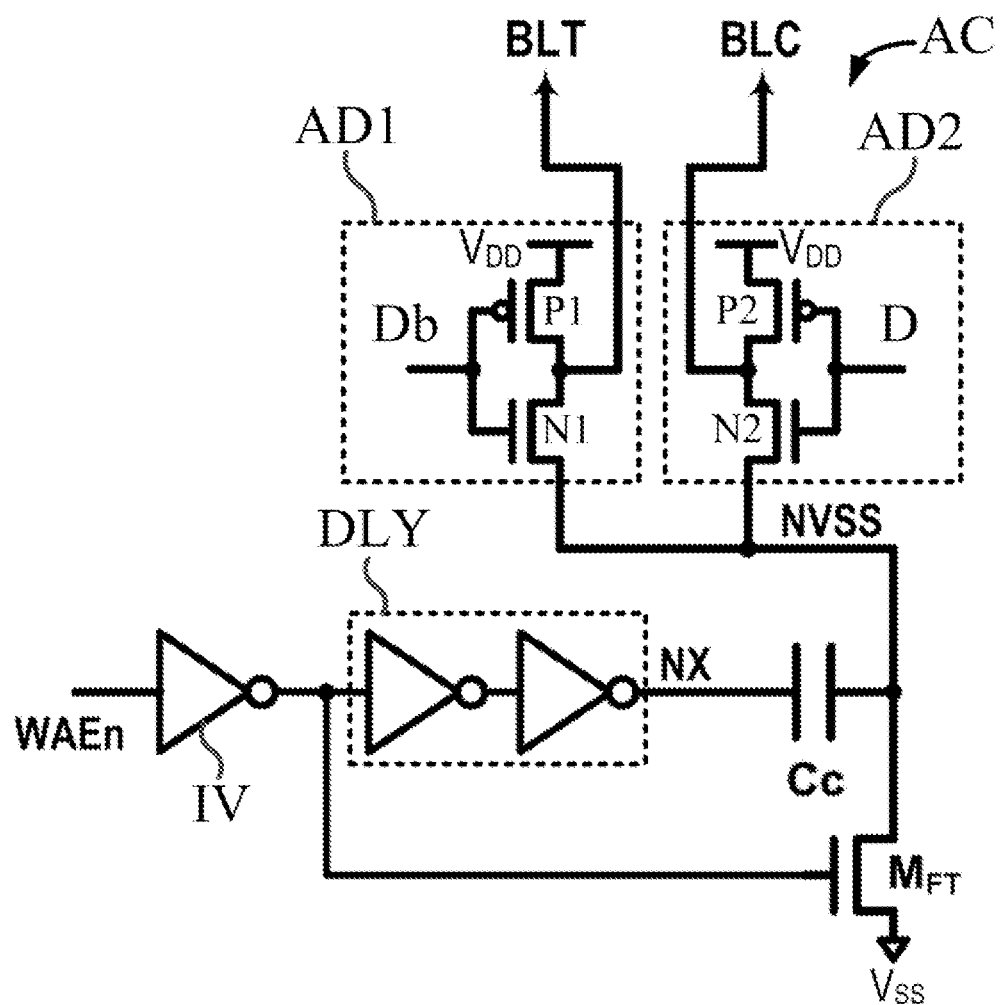
FIG. 7 shows an example of a detailed configuration of a write auxiliary circuit.
Figure 8:
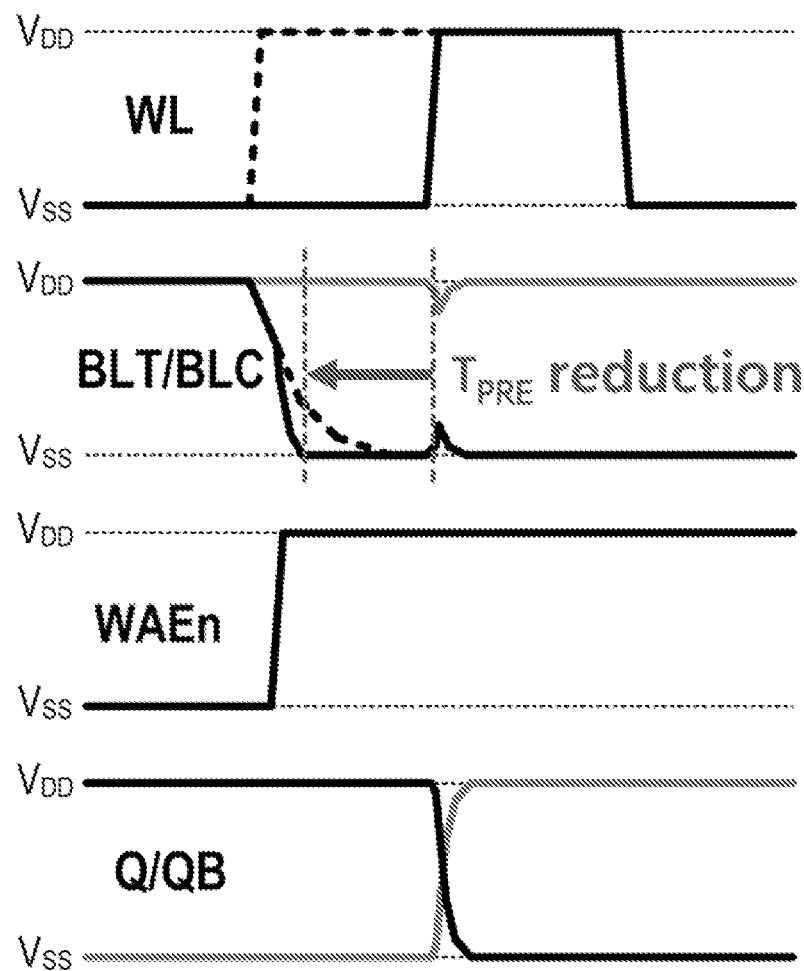
FIG. 8 is a diagram for explaining an SRAM write operation according to the write auxiliary circuit of FIG. 7.

FIG. 7 shows an example of a detailed configuration of a write auxiliary circuit, and FIG. 8 is a diagram for explaining an SRAM write operation according to the write auxiliary circuit of FIG. 7.

The write auxiliary circuit includes a plurality of auxiliary circuits (AC), but in FIG. 7, for convenience of description, only one auxiliary circuit (AC) corresponding to one bit line pair (BLT, BLC) selected by the write driver 44 is shown.

The auxiliary circuit (AC) receives a write auxiliary enable signal (WAEn), which is one of control signals, from the control circuit 42, and temporarily supplies a third voltage lower than the second voltage to one of the bit line pair (BLT, BLC) in response to the received write auxiliary enable signal (WAEn), thereby improving driving capability of the driver (WD1, WD2). Since it is assumed here that the second voltage is the ground voltage ($V_{SS}$), the third voltage may be a negative voltage.

Referring to FIG. 7, the auxiliary circuit (AC) may include two auxiliary drivers (AD1, AD2), an inverter (IV), a delay (DLY), an auxiliary transistor ($M_{FT}$) and a coupling capacitor ($C_C$).

The inverter (IV) receives and inverts the write auxiliary enable signal (WAEn) to output the inverted write auxiliary enable signal, and the delay (DLY) receives and delays the inverted write auxiliary enable signal, and outputs the delayed and inverted write auxiliary enable signal to one end of the coupling capacitor ($C_C$). Here, the inverter (IV) and the delay (DLY) are components for inverting and delaying the write auxiliary enable signal (WAEn), and may be referred to as an inverting delay circuit.

The auxiliary transistor ($M_{FT}$) is connected between the virtual ground node (NVSS) and the second voltage, and to its gate, an inverted write auxiliary enable signal is applied. When the write auxiliary enable signal (WAEn) is deactivated, the auxiliary transistor ($M_{FT}$) is turned on, and pulls down the voltage level of the virtual ground node (NVSS) to the second voltage level.

Each of the two auxiliary drivers (AD1, AD2) may include a PMOS transistor (P1, P2) and an NMOS transistor (N1, N2) connected in series between the first voltage and the virtual ground node (NVSS) and receiving inverted data (Db) or data (D) through their gates, respectively. When the auxiliary transistor ($M_{FT}$) is turned on, the two auxiliary drivers (AD1, AD2) operate as inverters because the virtual ground node (NVSS) is pulled down to the second voltage level. The first auxiliary driver (AD1) receives the inverted data (Db), inverts it, and applies the second voltage or the first voltage to the bit line (BLT), and the second auxiliary driver (AD2) receives the data (D), inverts it, and applies the first voltage or the second voltage to the bit line bar (BLC).

The coupling capacitor ($C_C$) is connected between the output terminal of the delay (DLY) and the virtual ground node (NVSS), so that when the delayed and inverted write auxiliary enable signal output from the delay (DLY) drops to a low level, the coupling capacitor ($C_C$) temporarily drops the voltage level of the virtual ground node (NVSS) to a third voltage level.

Referring to FIG. 8, the operation of the auxiliary circuit (AC) is described in detail as follows. The control circuit 42 applies the write control signal to the write driver 44, and then delays the write auxiliary enable signal (WAEn) and applies it to the write auxiliary circuit (WAC).

The write driver 44 is driven according to the write control signal and applies a voltage corresponding to data (D, db) to the bit line pair (BLT, BLC) to start pre-developing the voltage level of the bit line pair (BLT, BLC). Here, since it is assumed that the data (D) is "0", the bit line bar (BLC) is pre-developed to the first voltage level, while the voltage level of the bit line (BLT) starts to drop.

At this time, since the auxiliary transistor ($M_{FT}$) of the auxiliary circuit (AC) is turned on by the inverted write auxiliary enable signal, the virtual ground node (NVSS) has the second voltage level. In addition, in the first auxiliary driver (AD1), the first NMOS transistor (N1) is turned on in response to the inverted data (Db), and the first PMOS transistor (P1) is turned off. Accordingly, the first auxiliary driver (AD1) together with the first driver (WD1) applies the second voltage to the bit line (BLT). Meanwhile, in the second auxiliary driver (AD2), the second PMOS transistor (P2) is turned on in response to the data (D), and the second NMOS transistor (N2) is turned off. Accordingly, the second auxiliary driver (AD2) together with the second driver (WD2) applies the first voltage to the bit line bar (BLC). That is, the first and second auxiliary drivers (AD1, AD2) assist the first and second drivers (WD1, WD2) to apply an auxiliary voltage to the bit line pair (BLT, BLC).

Thereafter, the write auxiliary enable signal (WAEn) is activated at a high level and applied. The write auxiliary enable signal (WAEn) is activated with a shorter time delay than the pre-develop period ($T_{PRE}$), and the auxiliary transistor ($M_{FT}$) of the auxiliary circuit (AC) is turned off in response to the low-level inverted write auxiliary enable signal. That is, the connection between the virtual ground node (NVSS) and the second voltage is cut off.

Immediately thereafter, the delayed and inverted write auxiliary enable signal from the delay (DLY) transitions to a low level and is applied to the auxiliary capacitor ($C_C$), and the coupling capacitor ($C_C$) temporarily drops the voltage level of the virtual ground node (NVSS) to a third voltage level lower than the second voltage according to the delayed and inverted write auxiliary enable signal transitioned to a low level. At this time, since the first NMOS transistor (N1) of the first auxiliary driver (AD1) is turned on and the second NMOS transistor (N2) of the second auxiliary driver (AD2) is turned off, the third voltage of the virtual ground node (NVSS) is applied only to the bit line (BLT) and is not applied to the bit line bar (BLC).

If a voltage lower than the second voltage is applied to the bit line (BLT) even though it is temporary and is maintained at the third voltage only up to a distance close to the write driver 44 in the bit line (BLT) by the bit line resistance ($R_{BL}$), the voltage level at a distance far from the write driver 44 in the bit line (BLT) also quickly drops to the second voltage.

Accordingly, compared to the case where the write auxiliary circuit is not provided, the pre-develop period ($T_{PRE}$) can be greatly reduced. That is, even if the pre-develop phase is performed, the write operation time can be prevented from being increased.

Here, the reason why the write auxiliary enable signal (WAEn) is applied later than the write control signal is that the effect of supplying the third voltage by the auxiliary circuit (AC) is not great because a large current temporarily flows in the initial stage when the write driver 44 supplies the write voltage to the bit line pair (BLT, BLC) in response to the write control signal. However, since the write operation time increases as the delay time of the write auxiliary enable signal (WAEn) increases, the write auxiliary enable signal (WAEn) may be adaptively determined in consideration of the structure of the memory cell array 41.

Figure 9A:
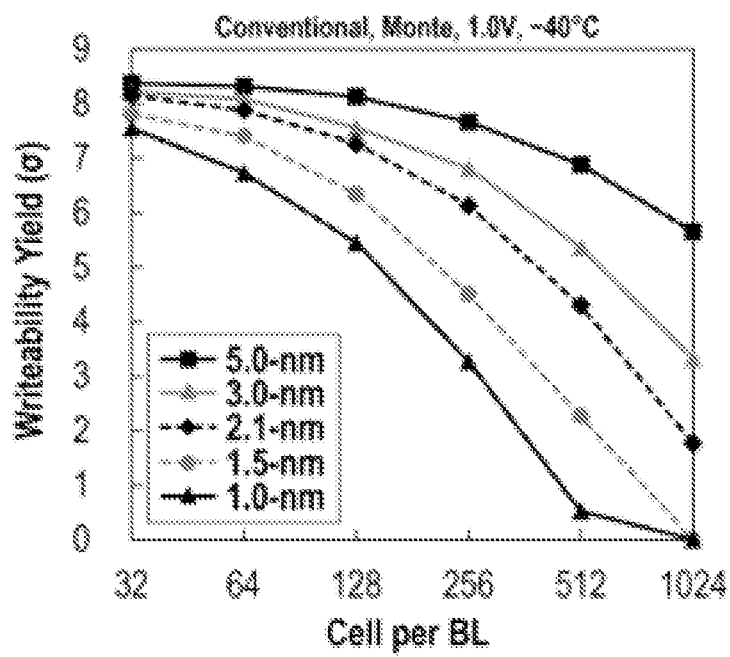
FIGS. 9A and 9B show a result of comparing the writeability yield of the SRAM memory cell according to the embodiment with that of the conventional one.
Figure 9B:
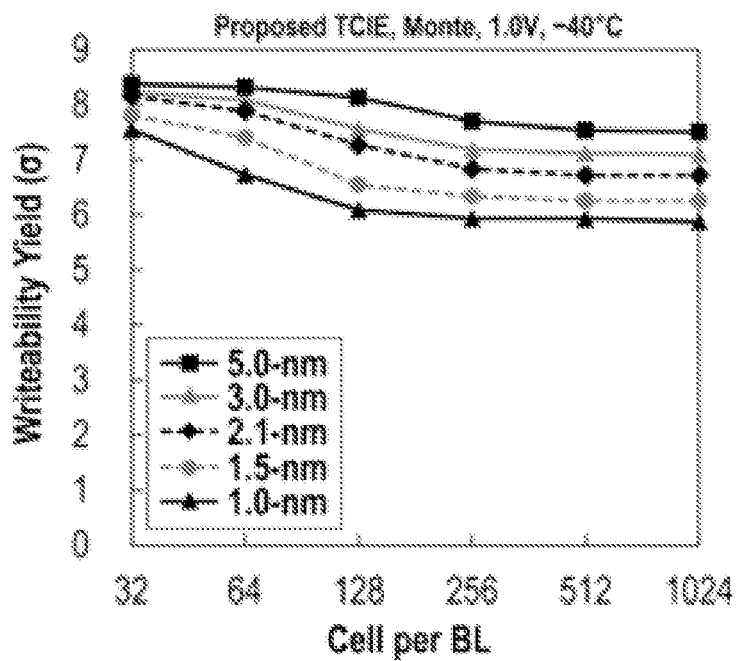

FIGS. 9A and 9B show a result of comparing the writeability yield of the SRAM memory cell according to the embodiment with that of the conventional one.

FIGS. 9A and 9B show a writeability yield change depending on the line width due to process miniaturization, wherein FIG. 9A shows a writeability yield according to the conventional write operation method, and FIG. 9B shows a writeability yield according to the write operation method of the present embodiment.

As shown in FIG. 9A, it can be seen that in the conventional write operation method, as the line width becomes narrower and the number of memory cells (MC) connected to each bit line (BL) increases, the writeability yield greatly decreases. In contrast, in the write operation method according to the present embodiment, as shown in FIG. 9B, it can be seen that even if the line width is narrowed and the number of memory cells (MC) connected to each bit line (BL) is increased, the writeability yield does not significantly decrease.

That is, in the write operation method according to the embodiment, the writeability yield can be maintained very high even if the process is miniaturized and the memory capacity is increased. Therefore, it is possible to greatly improve the reliability of a write operation of an SRAM manufactured in a microprocess without a separate additional configuration.

Although the present disclosure has been described in detail through representative embodiments above, those skilled in the art will understand that many modifications and other equivalent embodiments can be derived from the embodiments described herein. Therefore, the true technical scope of the present disclosure is to be defined by the technical spirit set forth in the appended scope of claims.

What is claimed is:

1. An SRAM comprising:
a memory cell array in which a plurality of memory cells each defined by a word line and a bit line pair are arranged;
a write driver that applies a write voltage corresponding to an applied data to the bit line pair connected to a memory cell; and
a word line driver activating the word line after the write voltage is applied to the bit line pair and after a pre-develop period,
wherein the pre-develop period is determined according to a time having a first voltage and a second voltage lower than the first voltage, by the write voltage applied to the bit line pair,
wherein the SRAM further include:
a write auxiliary circuit activated during the pre-develop period to temporarily apply a third voltage having a lower voltage level than the second voltage to a line to which the second voltage is applied among the bit line pair.

2. The SRAM according to claim 1,
wherein the SRAM further includes:
a control circuit that receives an address and a command, and if the received command is a write command, applies a column address and a write control signal to the write driver, and applies a row address to the word line driver after the pre-develop period.

3. The SRAM according to claim 2,
wherein the write auxiliary circuit includes:
an auxiliary transistor that is turned on, when a write auxiliary enable signal is deactivated, to drop a voltage level of a virtual ground node to the second voltage;
two auxiliary drivers respectively inverting data or inverted data and applying an auxiliary voltage to the bit line pair when the auxiliary transistor is turned on and the virtual ground node has the second voltage; and
a coupling capacitor temporarily dropping the voltage level of the virtual ground node to the third voltage by a coupling method when a delayed and inverted write auxiliary enable signal is applied in which the write auxiliary enable signal is inverted and delayed, after the auxiliary transistor is turned off.

4. The SRAM according to claim 3,
wherein the write auxiliary enable signal is applied from the control circuit, and is activated with a time delay shorter than the pre-develop period after the write control signal is activated.

5. The SRAM according to claim 4,
wherein each of the two auxiliary drivers includes a PMOS transistor and an NMOS transistor connected in series between the first voltage and the virtual ground node and having gates to which the inverted data or the data is applied.

6. The SRAM according to claim 1,
wherein the memory cell includes:
a latch having a structure in which two inverters are interconnected, each having a pull-up transistor and a pull-down transistor connected in series between the first voltage and the second voltage; and
two pass gate transistors connected between both ends of the latch and the bit line pair and having gates connected to the word line.

7. A write operation method of an SRAM, the SRAM having a memory cell array in which a plurality of memory cells each defined by a word line and a bit line pair are arranged, the write operation method comprising the steps of:
applying a write voltage corresponding to an applied data to the bit line pair connected to a memory cell; and
activating the word line after a pre-develop period after the write voltage is applied to the bit line pair,
wherein the pre-develop period is determined according to a time having a first voltage and a second voltage lower than the first voltage, by the write voltage applied to the bit line pair, and
wherein the write operation method of an SRAM further includes the step of:
applying a third voltage temporarily having a voltage level lower than the second voltage to a line to which the second voltage is applied among the bit line pair during the pre-develop period.

8. The write operation method of an SRAM according to claim 7,
wherein, the step of applying to the bit line pair includes:
when a write command and an address are applied, obtaining a row address and a column address from the applied address, and obtaining a write control signal from the write command; and
when the write control signal is activated, applying the write voltage to the bit line pair selected by the column address.

9. The write operation method of an SRAM according to claim 8,
wherein the step of activating the word line includes:
activating a word line selected by the row address after the pre-develop period after the write control signal is activated.

10. The write operation method of an SRAM according to claim 9,
wherein the step of applying the third voltage includes:
when a write auxiliary enable signal is deactivated, dropping a voltage level of a virtual ground node to the second voltage,
when the virtual ground node has the second voltage, respectively inverting data or inverted data and applying an auxiliary voltage to the bit line pair, and
after the write auxiliary enable signal is re-activated, temporarily dropping the voltage level of the virtual ground node to the third voltage level in a coupling according to a delayed and inverted write auxiliary enable signal in which the write auxiliary enable signal is inverted and delayed.

11. The write operation method of an SRAM according to claim 10,
wherein the write auxiliary enable signal is activated with a time delay shorter than the pre-develop period after the write control signal is activated.

12. The write operation method of an SRAM according to claim 7,
wherein the memory cell is implemented with a 6T SRAM memory cell.

* * * * *